United States Patent
Iwamoto et al.

(10) Patent No.: US 11,984,869 B2
(45) Date of Patent: May 14, 2024

(54) ACOUSTIC WAVE DEVICE

(71) Applicant: Murata Manufacturing Co., Ltd., Nagaokakyo (JP)

(72) Inventors: Hideki Iwamoto, Nagaokakyo (JP); Takashi Yamane, Nagaokakyo (JP); Yasumasa Taniguchi, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 630 days.

(21) Appl. No.: 17/223,061

(22) Filed: Apr. 6, 2021

(65) Prior Publication Data

US 2021/0226603 A1    Jul. 22, 2021

Related U.S. Application Data

(63) Continuation of application No. PCT/JP2019/040902, filed on Oct. 17, 2019.

(30) Foreign Application Priority Data

Oct. 19, 2018    (JP) .................................. 2018-197173

(51) Int. Cl.
*H03H 9/02*    (2006.01)
*H03H 9/145*    (2006.01)
(Continued)

(52) U.S. Cl.
CPC .... *H03H 9/02574* (2013.01); *H03H 9/14502* (2013.01); *H03H 9/15* (2013.01); *H10N 30/87* (2023.02)

(58) Field of Classification Search
CPC ... H03H 9/02574; H03H 9/14502; H03H 9/15
(Continued)

(56) References Cited

U.S. PATENT DOCUMENTS

2008/0067891 A1    3/2008    Matsuda et al.
2009/0121584 A1*   5/2009    Nishimura ......... H03H 9/14541
                                                        310/313 B
(Continued)

FOREIGN PATENT DOCUMENTS

JP    10-145171 A    5/1998
JP    2004-260625 A    9/2004
(Continued)

OTHER PUBLICATIONS

Official Communication issued in International Patent Application No. PCT/JP2019/040902, mailed on Nov. 26, 2019.

*Primary Examiner* — Derek J Rosenau
(74) *Attorney, Agent, or Firm* — Keating & Bennett, LLP

(57) ABSTRACT

An acoustic wave device includes a piezoelectric body including first and second main surfaces facing each other, an IDT electrode provided on the first main surface of the piezoelectric body and including electrode fingers, a high acoustic velocity member on the second main surface side of the piezoelectric body, in which an acoustic velocity of a propagating bulk wave is higher than an acoustic velocity of an acoustic wave propagating through the piezoelectric body, and a first dielectric film provided on an upper surface of the electrode fingers, in which a portion where a dielectric is not present is provided between the electrode fingers of the IDT electrode.

19 Claims, 14 Drawing Sheets

(51) Int. Cl.
*H03H 9/15* (2006.01)
*H10N 30/87* (2023.01)

(58) Field of Classification Search
USPC ............... 310/313 R, 313 A, 313 B, 313 C
See application file for complete search history.

(56) References Cited

U.S. PATENT DOCUMENTS

| | | | | |
|---|---|---|---|---|
| 2009/0206955 | A1* | 8/2009 | Iizawa | H03H 9/02551 |
| | | | | 333/195 |
| 2013/0285768 | A1* | 10/2013 | Watanabe | H03H 9/02574 |
| | | | | 333/193 |
| 2016/0359468 | A1* | 12/2016 | Taniguchi | H03H 9/02921 |
| 2019/0273481 | A1 | 9/2019 | Michigami | |

FOREIGN PATENT DOCUMENTS

| | | | |
|---|---|---|---|
| JP | 2008-078739 | A | 4/2008 |
| JP | 2013-106089 | A | 5/2013 |
| JP | 2014-175885 | A | 9/2014 |
| JP | 2015-073331 | A | 4/2015 |
| WO | 2007/034832 | A1 | 3/2007 |
| WO | 2012/086639 | A1 | 6/2012 |
| WO | 2013/081026 | A1 | 6/2013 |
| WO | 2015/151706 | A1 | 10/2015 |
| WO | 2018/097201 | A1 | 5/2018 |

\* cited by examiner

ACOUSTIC WAVE DEVICE

CROSS REFERENCE TO RELATED APPLICATIONS

This application claims the benefit of priority to Japanese Patent Application No. 2018-197173 filed on Oct. 19, 2018 and is a Continuation Application of PCT Application No. PCT/JP2019/040902 filed on Oct. 17, 2019. The entire contents of each application are hereby incorporated herein by reference.

BACKGROUND OF THE INVENTION

1. Field of the Invention

The present invention relates to an acoustic wave device including a piezoelectric body that is laminated directly or indirectly on a high acoustic velocity member, an acoustic wave filter including the acoustic wave device, a composite filter device, a high-frequency front end circuit, and a communication device.

2. Description of the Related Art

WO2012/086639 discloses an acoustic wave device having a structure in which a piezoelectric body is laminated directly or indirectly on a high acoustic velocity member. In WO2012/086639, an IDT electrode is provided on a piezoelectric body. Further, in WO2012/086639, a dielectric film is provided so as to cover the IDT electrode on the piezoelectric body.

In the acoustic wave device described in WO2012/086639, the piezoelectric body is directly or indirectly laminated on the high acoustic velocity member. In this structure, it is possible to increase a Q value.

However, the inventors of preferred embodiments of the present invention have discovered that when the dielectric film covers the IDT electrode including a region between the electrode fingers of the IDT electrode, the Q value may be deteriorated due to the influence of the dielectric film. Therefore, the advantage of the acoustic wave device having a high Q value tends to be impaired.

SUMMARY OF THE INVENTION

Preferred embodiments of the present invention provide acoustic wave devices in each of which degradation of a Q value is unlikely to occur. Preferred embodiments of the present invention also provide acoustic wave filters, composite filter devices, high-frequency front end circuits, and communication devices including acoustic wave devices according to preferred embodiments of the present invention.

An acoustic wave device according to a preferred embodiment of the present invention includes a piezoelectric body including one main surface and another main surface that face each other, an IDT electrode on the one main surface of the piezoelectric body and including a plurality of electrode fingers, a high acoustic velocity member on the other main surface of the piezoelectric body, in which an acoustic velocity of a propagating bulk wave is higher than an acoustic velocity of an acoustic wave propagating through the piezoelectric body, and a first dielectric film on an upper surface of the electrode finger, wherein a portion where a dielectric is not present is between the electrode fingers of the IDT electrode.

An acoustic wave filter according to a preferred embodiment of the present invention includes an acoustic wave device according to a preferred embodiment of the present invention.

A composite filter device according to a preferred embodiment of the present invention includes a plurality of band pass filters including ends connected in common to each other, and at least one of the band pass filters is an acoustic wave filter according to a preferred embodiment of the present invention.

A high-frequency front end circuit according to a preferred embodiment of the present invention includes an acoustic wave device according to a preferred embodiment of the present invention, and a power amplifier.

A communication device according to a preferred embodiment of the present invention includes a high-frequency front end circuit according to a preferred embodiment of the present invention and an RF signal processing circuit.

According to preferred embodiments of the present invention, it is possible to reduce or prevent the deterioration of a Q value.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be clearly understood from the following detailed description with reference to the accompanying drawings.

It should be noted that the preferred embodiments described in this specification are merely exemplary, and that a partial replacement or a combination of configurations is possible between different preferred embodiments.

Figure 1A:
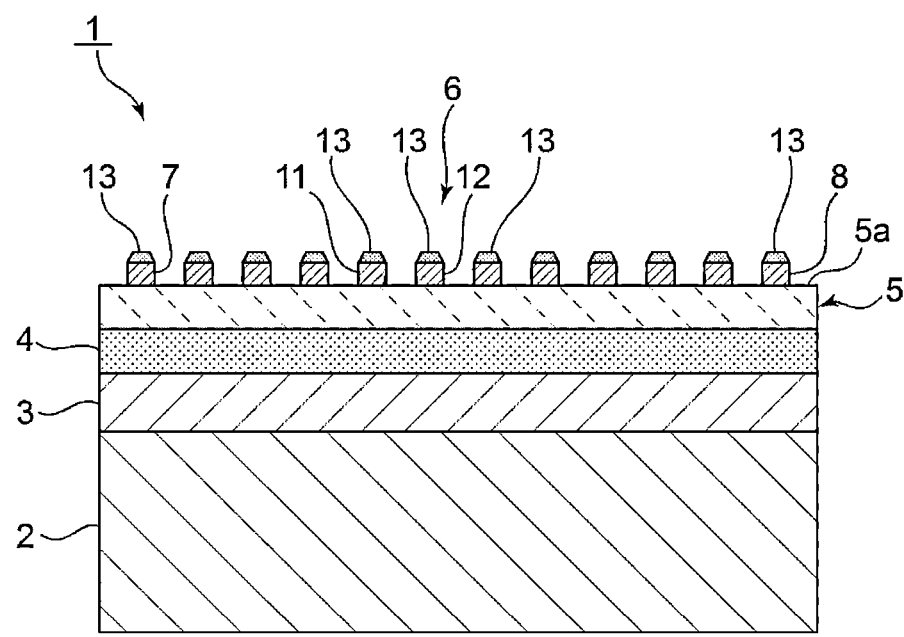
FIG. 1A is a front sectional view of an acoustic wave device according to a first preferred embodiment of the present invention.
Figure 1B:
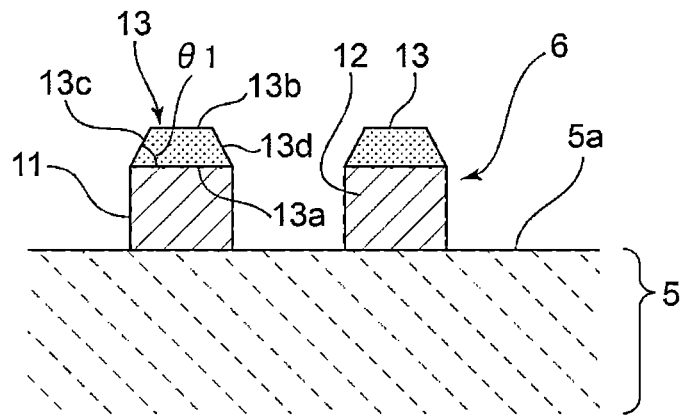
FIG. 1B is a partially enlarged front sectional view illustrating a main portion thereof in an enlarged manner.
Figure 2:
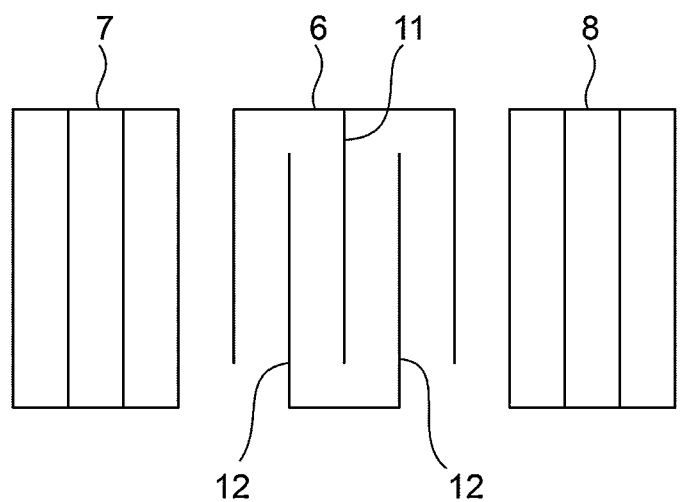
FIG. 2 is a schematic plan view illustrating an electrode structure of the acoustic wave device according to the first preferred embodiment of the present invention.

FIG. 1A is a front sectional view of an acoustic wave device according to a first preferred embodiment of the present invention, and FIG. 1B is a partially enlarged front sectional view illustrating a main part thereof in an enlarged manner. FIG. 2 is a schematic plan view illustrating an electrode structure of the acoustic wave device according to the first preferred embodiment.

A high acoustic velocity member 3 and a low acoustic velocity film 4 are laminated on a support substrate 2. A piezoelectric body 5 is laminated on the low acoustic velocity film 4. On an upper surface 5a of the piezoelectric body 5, an IDT electrode 6 and reflectors 7 and 8 are provided. An acoustic wave device 1 is, for example, a one-port acoustic wave resonator.

The IDT electrode 6 includes a plurality of first electrode fingers 11 and a plurality of second electrode fingers 12. As illustrated in an enlarged manner in FIG. 1B, a first dielectric film 13 is laminated on the first electrode finger 11 and the second electrode finger 12. The first dielectric film 13 is not provided in the entire area of a gap between the first electrode finger 11 and the second electrode finger 12.

Note that, as will be described later, in preferred embodiments of the present invention, a dielectric may be present in a partial region between the electrode fingers. That is, there may be a region in which a dielectric is not present between the electrode fingers. Note that the dielectric not present between the electrode fingers includes all of the dielectrics including the first dielectric film 13. In other words, a case where there is a region in which a dielectric is not present between the electrode fingers means a case where the first dielectric film 13 is not provided between the electrode fingers and no dielectric film other than the first dielectric film 13 is provided. Note that there may be a region in which a dielectric is not present between all of the electrode fingers of the IDT electrode, and there may be a portion in which a dielectric is not present between at least a portion of the electrode fingers.

In the first preferred embodiment, since no dielectric is present between the electrode fingers, degradation of a Q value is less likely to occur. This point will be described in detail with reference to Example 1 of the first preferred embodiment and Comparative Examples 1 and 2 which will be described later.

Referring to FIG. 1A, in the present preferred embodiment, the support substrate 2 is preferably a silicon substrate, for example. However, a material of the support substrate 2 is not particularly limited, and a piezoelectric material such as, for example, aluminum oxide, diamond, sapphire, lithium tantalate, lithium niobate, and quartz; a dielectric such as various ceramics such as alumina, magnesia, silicon nitride, aluminum nitride, silicon carbide, zirconia, cordierite, mullite, steatite, and forsterite, and glass; a semiconductor such as gallium nitride; resin, or the like can be used.

The high acoustic velocity member 3 is made of a high acoustic velocity material in which an acoustic velocity of a propagating bulk wave is higher than an acoustic velocity of an acoustic wave propagating through the piezoelectric body 5. In the present preferred embodiment, the high acoustic velocity member 3 is preferably made of aluminum nitride. However, as long as the acoustic wave can be confined, as the high acoustic velocity material, various materials such as, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, DLC (diamond-like carbon) films or diamond, a medium containing the above-described material as a main component, a medium containing a mixture of the above materials as a main component, or the like can be used. In order to confine the acoustic wave in a portion in which the piezoelectric body 5 and the low acoustic velocity film 4 are laminated, in the high acoustic velocity member 3, a greater thickness thereof is more preferable, and the thickness is preferably equal to or more than about 0.5 times, and more preferably equal to or more than about 1.5 times a wave length λ of the acoustic wave.

Note that, in the specification, the term main component refers to a component more than about 50% by weight of a material.

The low acoustic velocity film 4 is made of an appropriate material in which an acoustic velocity of a propagating bulk wave is lower than an acoustic velocity of a bulk wave propagating through the piezoelectric body 5. In the present preferred embodiment, the low acoustic velocity film 4 is preferably made of silicon oxide, for example. However, as the material of the low acoustic velocity film, it is possible to use, for example, silicon oxynitride, tantalum carbide, glass, and the like, in addition to silicon oxide. Further, as a compound in which fluorine, carbon, boron, or the like, for example, is added to these materials, a medium containing these elements as a main component may be used.

The piezoelectric body 5 is preferably of a $LiTaO_3$, for example. However, the piezoelectric body 5 may be made using another piezoelectric material such as $LiNbO_3$ and ZnO, for example.

The IDT electrode 6 and the reflectors 7 and 8 are made of an appropriate metal. Such metal is not particularly limited. In addition, a laminated metal film formed by laminating a plurality of metal films may be used.

The first dielectric film 13 is preferably made of silicon oxide, for example. However, a material of the first dielectric film 13 is not limited to this. Other dielectric materials, such as, for example, silicon oxynitride, alumina, and the like, may be used. In addition, the first dielectric film 13 may be made of a mixed material including these dielectrics as a main component.

The first dielectric film 13 has a tapered shape. The first dielectric film 13 includes a lower surface 13a, an upper surface 13b, and first and second side surfaces 13c and 13d. The lower surface 13a laminated on the first electrode finger 11. The upper surface 13b faces the lower surface 13a in a thickness direction of the first dielectric film 13. The first side surface 13c and the second side surface 13d face each other in a width direction of the first electrode finger 11. As illustrated in FIG. 1B, the first dielectric film 13 has a tapered shape so that a width dimension thereof decreases from the lower surface 13a toward the upper surface 13b. The width dimension refers to a dimension along the width direction of the first electrode finger 11.

Therefore, the first side surface 13c and the second side surface 13d are inclined so as to be closer to each other toward the upper side. Here, an angle between the first side surface 13c with the lower surface 13a is defined as a taper angle θ1. The second side surface 13d also forms the taper angle θ1 with respect to the lower surface 13a. Similarly, also on the second electrode finger 12, the first dielectric film 13 has a tapered shape.

Next, a description will be provided of an increase of the Q value in the acoustic wave device 1 based on a specific experimental example.

An acoustic wave device of Example 1 of the first preferred embodiment was prepared.

A wave length determined by an electrode finger pitch of the IDT electrode was defined as λ. λ=about 2 μm was set.

The number of pairs of electrode fingers of the IDT electrode 6=67 pairs.

A duty of the IDT electrode 6=about 0.45.

The width direction dimension of the first and second electrode fingers 11 and 12=about 0.45 μm.

An intersecting width=about 90 μm.

The number of electrode fingers of each of the reflectors 7 and 8=41.

The material of the IDT electrode 6 and the reflectors 7 and 8: Al. The thickness=about 145 nm.

The first dielectric film 13: silicon oxide film, the thickness=about 35 nm, and the taper angle θ1=about 55°.

The width direction dimension of the lower surface 13a=about 0.385 μm.

The width direction dimension of the upper surface 13b=about 0.338 μm.

The thickness of the first dielectric film 13=about 0.025λ, that is, about 2.5% of the wave length.

As Comparative Example 1, an acoustic wave device configured in the same or similar manner as in Example 1 was prepared, except that the silicon oxide film was provided with a thickness of about 0.025λ in the entire area of the gap between the electrode fingers.

Further, as Comparative Example 2, an acoustic wave device was prepared in the same or similar manner as in Example 1, except that the first dielectric film 13 was not provided.

Figure 5:
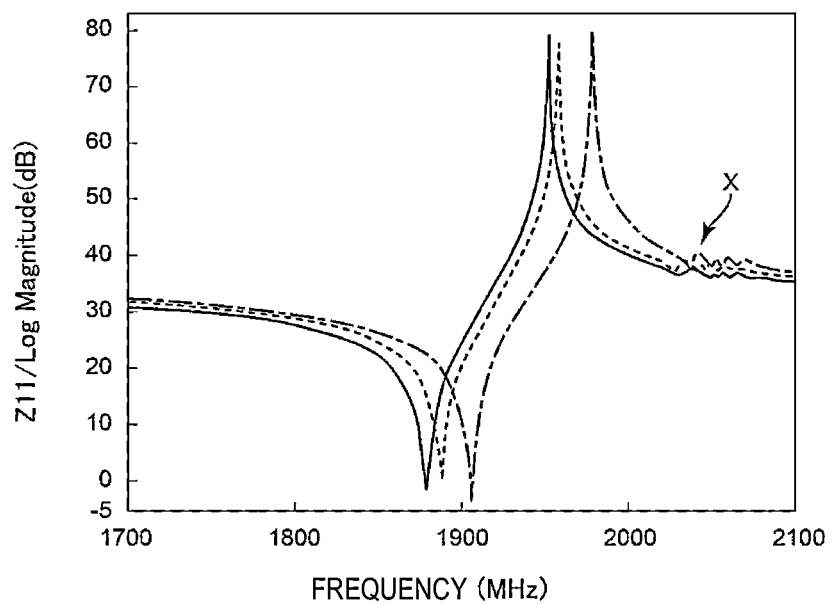
FIG. 5 is a diagram illustrating resonance characteristics of an acoustic wave device of Example 1 of the first preferred embodiment of the present invention and acoustic wave devices of Comparative Example 1 and Comparative Example 2.
Figure 6:
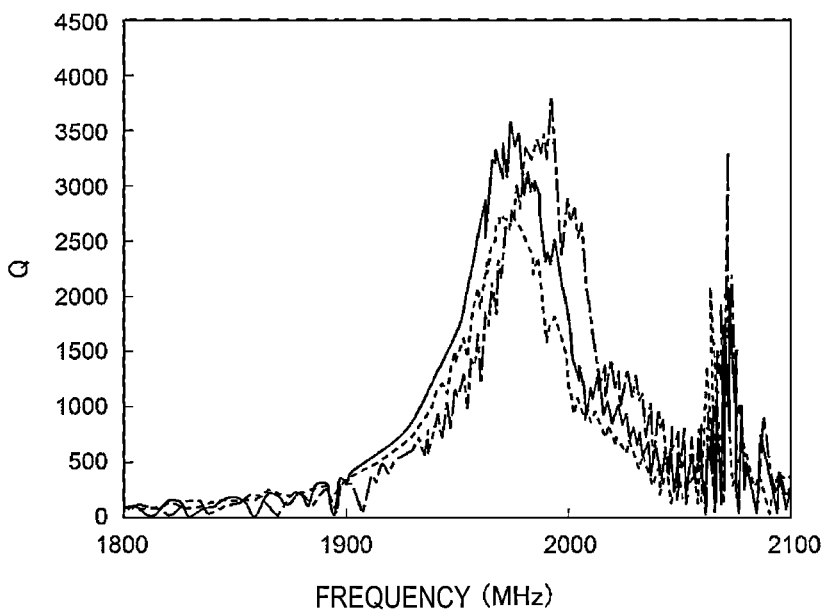
FIG. 6 is a diagram illustrating Q characteristics of the acoustic wave devices of Example 1 and Comparative Example 1 and Comparative Example 2.

FIG. 5 illustrates resonance characteristics of the acoustic wave device of Example 1 and the acoustic wave devices of Comparative Example 1 and Comparative Example 2, and FIG. 6 is a diagram illustrating Q characteristics. In FIG. 5 and FIG. 6, solid lines indicate results of Example 1, dashed lines indicate results of Comparative Example 1, and alternate long and short dash lines indicate results of Comparative Example 2.

As is apparent from FIG. 5, a peak-to-valley ratio in the resonance characteristics of the main mode is large in Example 1, as compared with Comparative Example 1 and Comparative Example 2. In addition, the response of the higher order mode indicated by an arrow X is also small in Example 1, as compared with in Comparative Example 1 and Comparative Example 2.

As illustrated in FIG. 6, the Q value is excellent in Comparative Example 2 in which no first dielectric film is provided, whereas the Q characteristic is considerably worse in Comparative Example 1 in which the first dielectric film is present between the electrode fingers. On the other hand, in Example 1, the Q characteristics equivalent to those in Comparative Example 1 are achieved.

Therefore, it can be seen from Example 1 that good resonance characteristics can be obtained without deteriorating Q characteristics in the acoustic wave device in which the piezoelectric body 5 is directly or indirectly laminated on the high acoustic velocity member.

Figure 7:
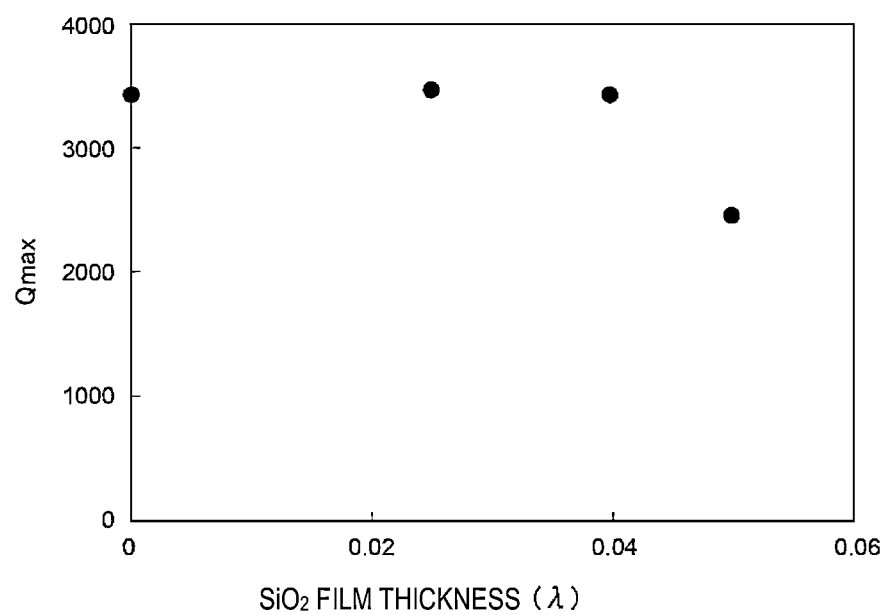
FIG. 7 is a diagram illustrating a relationship between a SiO$_2$ film thickness ($\lambda$) as a first dielectric film and Q$_{max}$.

In the acoustic wave device having the same or substantially the same structure as that in Example 1, the thickness of the first dielectric film 13 was changed. FIG. 7 is a diagram illustrating a relationship between the thickness of the above described first dielectric film 13 and $Q_{max}$. As is apparent from FIG. 7, when the thickness of the first dielectric film 13 increases, in particular, when the thickness exceeds about 0.04λ, the $Q_{max}$ sharply decreases. Therefore, preferably, the film thickness of the first dielectric film 13 is equal to or less than about 0.04λ, i.e., equal to or less than about 4% of the wave length λ.

Figure 3:
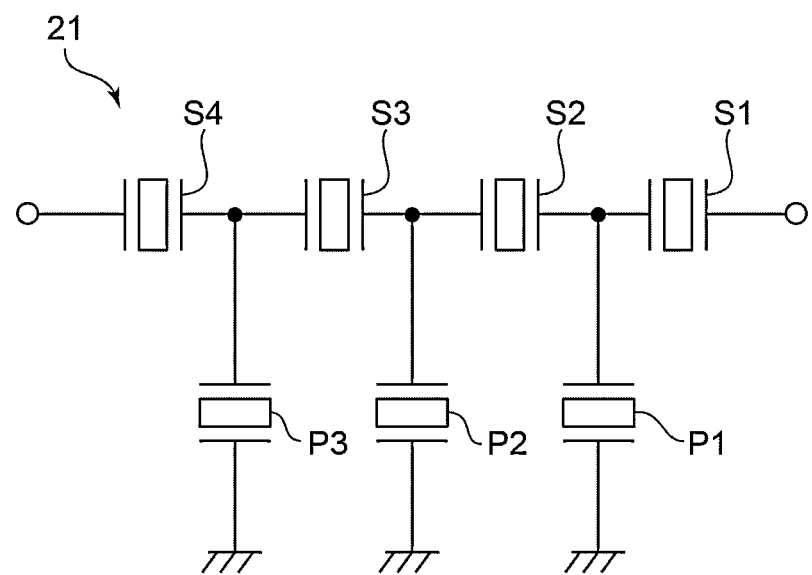
FIG. 3 is a circuit diagram of an acoustic wave filter according to a second preferred embodiment of the present invention.

FIG. 3 is a circuit diagram of an acoustic wave filter according to a second preferred embodiment of the present invention. An acoustic wave filter 21 is, for example, a ladder filter including a plurality of acoustic wave resonators. A plurality of series arm resonators S1 to S4 and a plurality of parallel arm resonators P1 to P3 each include an acoustic wave resonator. At least one of the acoustic wave resonators is the acoustic wave device 1 described above.

Note that the acoustic wave filter of the second preferred embodiment is not limited to including a ladder circuit. An acoustic wave filter including an acoustic wave device according to a preferred embodiment of the present invention may be used.

Figure 4:
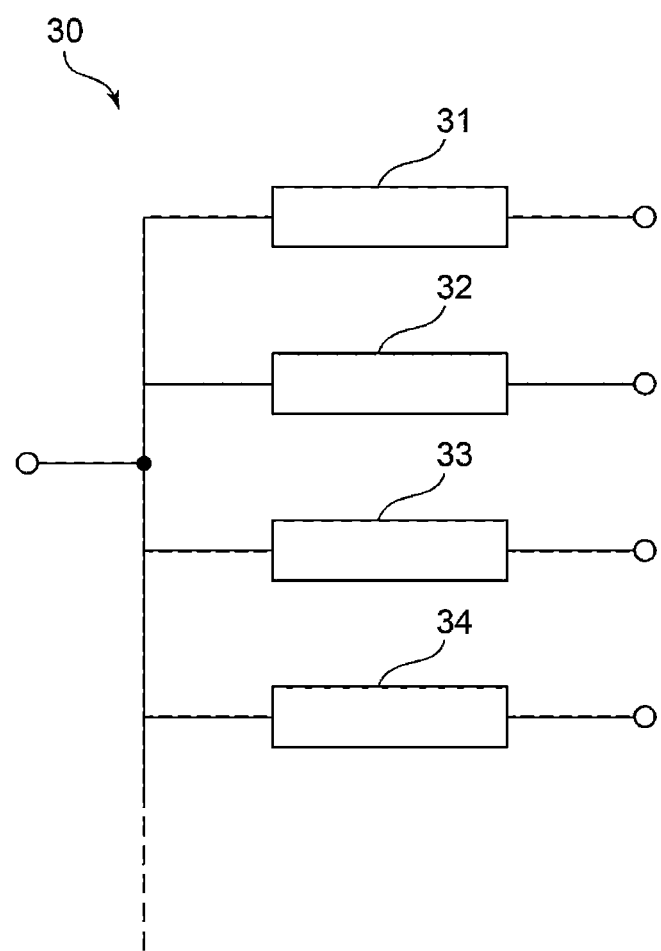
FIG. 4 is a circuit diagram of a composite filter device according to a third preferred embodiment of the present invention.

FIG. 4 is a circuit diagram of a composite filter device according to a third preferred embodiment of the present invention. In a composite filter device 30, one ends of a plurality of band pass filters 31 to 34 are connected in common. The composite filter device 30 is suitably used in a CA (carrier aggregation) system. That is, the composite filter device 30 is suitably used to simultaneously transmit and receive a reception signal, a transmission signal, and the like, for example, of a plurality of bands. In this case, at least one of the plurality of band pass filters 31 to 34 may be an acoustic wave filter according to a preferred embodiment of the present invention. In that case, it is possible to reduce the Q value of the acoustic wave device, and thus it is possible to obtain good filter characteristics.

Figure 8A:
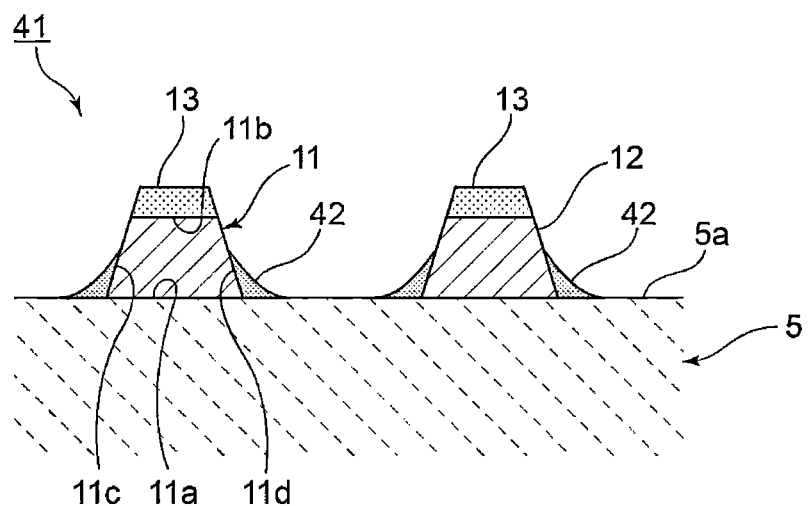
FIG. 8A is a partially enlarged front sectional view for describing an acoustic wave device according to a fourth preferred embodiment of the present invention.
Figure 8B:
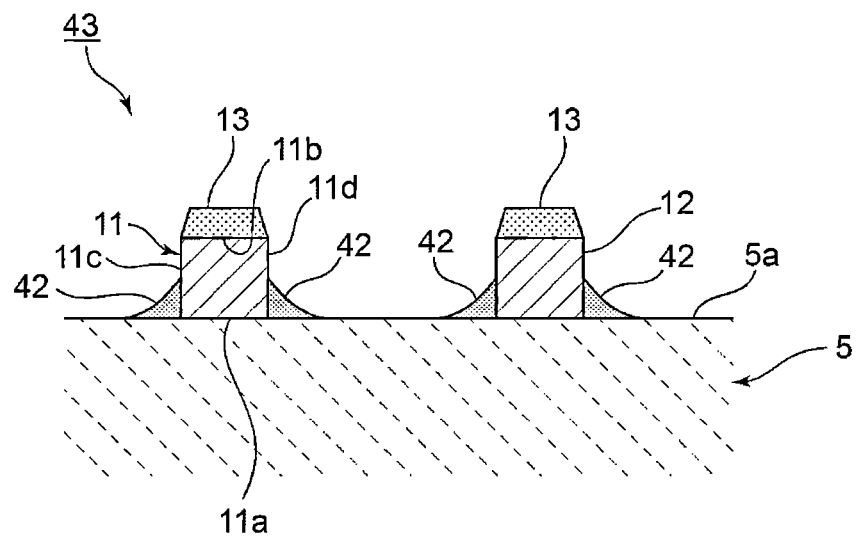
FIG. 8B is a partially enlarged front sectional view for describing an acoustic wave device according to a fifth preferred embodiment of the present invention.

FIG. 8A is a partially enlarged front sectional view for describing an acoustic wave device according to a fourth preferred embodiment of the present invention, and FIG. 8B is a partially enlarged front sectional view for describing an acoustic wave device according to a fifth preferred embodiment.

In an acoustic wave device 41 illustrated in FIG. 8A, the first electrode finger 11 and the second electrode finger 12 have a tapered shape. When the first electrode finger 11 is representatively described, the first electrode finger 11 includes a lower surface 11a, an upper surface 1ib, and a pair of side surfaces 11c and 11d. The first electrode finger 11 is tapered so that the side surface 11c and the side surface 11d become closer to each other in the width direction of the electrode finger toward an upper side from the upper surface 5a of the piezoelectric body 5. As described above, the first electrode finger 11 may include a taper.

In addition, in the acoustic wave device 41 of the fourth preferred embodiment, a fillet 42 made of a dielectric is provided in a partial region of the gap between electrode fingers of the first electrode finger 11 and the second electrode finger 12. As described above, preferred embodiments of the present invention are not limited to a structure in which the dielectric is not provided in the entire area between the electrode fingers. That is, a dielectric, such as the fillet 42, for example, may be present in a partial region between the electrode fingers.

Also, as in an acoustic wave device 43 of the fifth preferred embodiment illustrated in FIG. 8B, the fillet 42 may also be provided in the gap between the first and second electrode fingers 11 and 12 that are not tapered. Due to the fillet 42 being provided, the acoustic wave device according to the fourth and fifth preferred embodiments can reduce stress applied to a boundary between the first and second electrode fingers 11 and 12 and the piezoelectric body 5 and the vicinity of the boundary. As such, thermal shock resistance can be improved, and IMD characteristics can be improved. This will be described with reference to FIG. 9.

Figure 9:
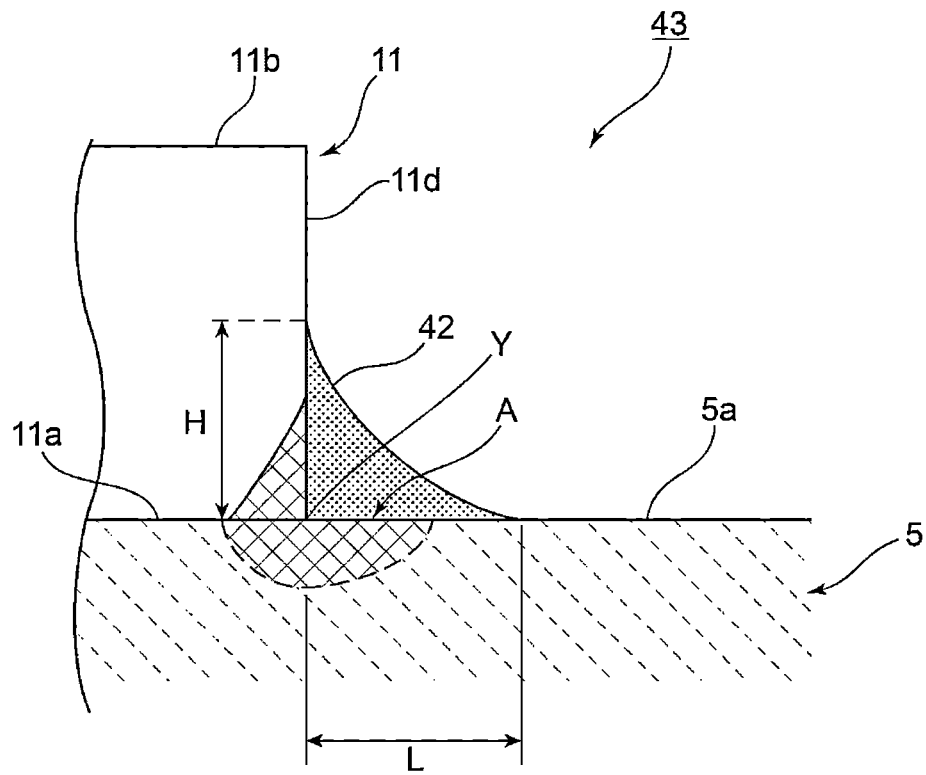
FIG. 9 is a view illustrating a portion in which a fillet is provided in an acoustic wave device according to a fifth preferred embodiment of the present invention in an enlarged manner.

FIG. 9 is an enlarged view illustrating a portion in which the fillet 42 is provided in the acoustic wave device 43 according to the fifth preferred embodiment. When the thermal shock is applied or when the heat is generated while driving, a large stress is applied to a region indicated by hatching in the vicinity of a boundary Y between the first electrode finger 11 and the upper surface 5a of the piezoelectric body 5. When the fillet 42 is provided, distortion due to the stress can be reduced or prevented, and stress concentration can be reduced. As such, the thermal shock resistance and the IMD characteristics can be improved.

Here, in order to achieve the above-described advantageous effects, the fillet 42 is made of a dielectric, and extends from the side surface 11d of the first electrode finger 11 so as to extend, through the boundary Y, to a portion of the area of the gap on the upper surface 5a of the piezoelectric body 5. Here, an upper end of the fillet may be an upper end of the side surface 11d of the first electrode finger 11. That is, the upper end of the fillet 42 is not limited to within the side surface 11d, and may extend to an upper end edge of the side surface 11d. FIG. 9 illustrates a cross section in a direction perpendicular or substantially perpendicular to a length direction of the first electrode finger 11. In a cross section perpendicular or substantially perpendicular to the length direction, an outer surface of the fillet 42 has a curved shape that is recessed toward a corner portion which is the boundary Y described above.

Here, a height H and a length L of the fillet 42 are defined as follows.

Figure 10:
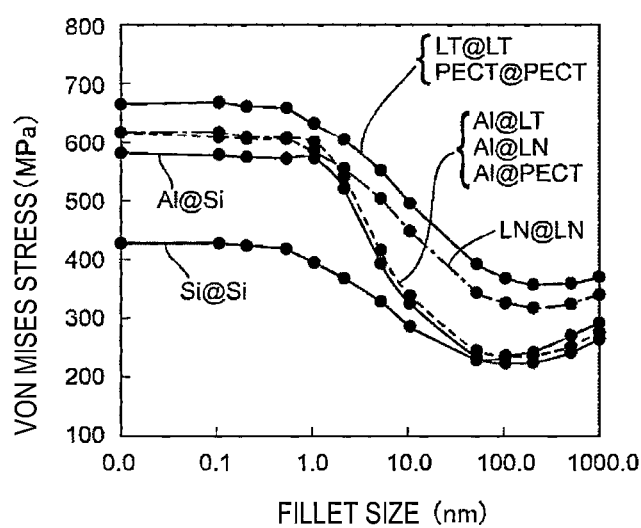
FIG. 10 is a diagram illustrating a relationship between a size of the fillet and the von Mises stress.

The height H is a dimension between the boundary Y and the upper end of the fillet 42 on the side surface 11d. The length L is a dimension between the boundary Y and the farthest end portion on the upper surface 5a of the piezoelectric body 5 of the fillet 42. Here, a relationship between the dimension L of the fillet and the von Mises stress is shown in FIG. 10. FIG. 10 is a diagram illustrating the relationship between the dimension of the fillet and the von Mises stress applied to the piezoelectric body 5 made of LiTaO₃ and the first electrode finger 11. Note that, FIG. 10 illustrates results of four kinds of structures: a) to d).

a) A structure in which an electrode finger made of Al is laminated on LiTaO₃.

The stress on the upper surface side of the LiTaO₃ in this case is denoted by LT@LT. Further, the stress on the side of the electrode finger made of Al is denoted by Al@LT.

b) A structure in which an electrode finger made of Al is laminated on LiNbO₃.

In FIG. 10, LN@LN represents the stress on the LiNbO₃ side in this structure. Al@LN denotes the stress on the side of the electrode finger made of Al in this structure.

c) A structure in which Al is laminated on a Si substrate.

In this case, Si@Si denotes the stress on the Si substrate side. Al@Si denotes the stress on the side of the electrode finger made of Al in this structure.

d) A structure in which a high acoustic velocity member, a low acoustic velocity film, and a piezoelectric body are laminated as in the first preferred embodiment.

The stress on the piezoelectric body side in this structure is denoted by PECT@PECT. The stress on the side of the electrode finger made of Al in this structure is denoted by Al@PECT.

Note that, in FIG. 10, as described above, fillet size dependence of the two types of stresses is shown for each of the structures a) to d). However, in FIG. 10, Al@LT, Al@LN, and Al@PECT have almost the same value and overlap each other, so that they are indicated by one dashed line. Similarly, LT@LT and PECT@PECT also overlap each other, and thus are indicated by one solid line.

As is apparent from FIG. 10, it can be seen that, in any of the structures a) to d), when the fillet dimension L is equal to or more than about 1.0 nm, the stress can be effectively reduced.

Note that, from FIG. 10, it is understood that the stress can be reduced, as compared with a case where the fillet dimension L is less than about 1.0 nm, in a range of equal to or less than about 1000 nm, for example.

In addition, as in the fourth preferred embodiment illustrated in FIG. 8A, it is preferable that the first and second electrode fingers 11 and 12 are tapered. As such, it is possible to further reduce the stress.

Figure 11:
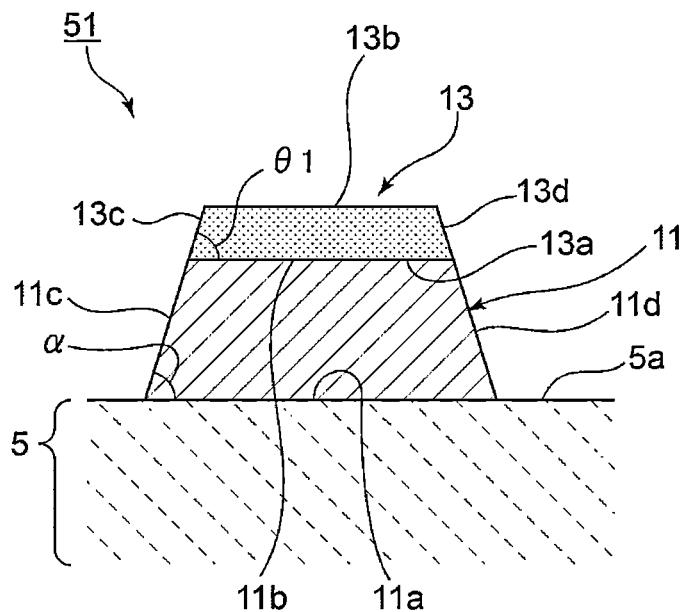
FIG. 11 is a partially enlarged front sectional view for describing an acoustic wave device according to a sixth preferred embodiment of the present invention, and is a diagram for describing a taper angle θ1 between a first side surface of a first dielectric film and a lower surface of the first dielectric film, and an angle α between a side surface of an electrode finger and an upper surface of a piezoelectric body.

FIG. 11 is a partially enlarged front sectional view for describing an acoustic wave device according to a sixth preferred embodiment of the present invention. In an acoustic wave device 51 of the sixth preferred embodiment, the first electrode finger 11 has a tapered shape, and the first dielectric film 13 also has a tapered shape. Although not illustrated, the second electrode finger 12 side is also configured in the same or substantially the same manner. Here, in the acoustic wave device 51, the taper angle θ1 of the first side surface 13c and the second side surface 13d of the first dielectric film 13 is preferably set to be, for example, equal to or more than about 50° and equal to or less than about 88°. As such, it is possible to effectively reduce or prevent the higher order mode which is closest to the main mode. This will be described with reference to FIG. 12.

Figure 12:
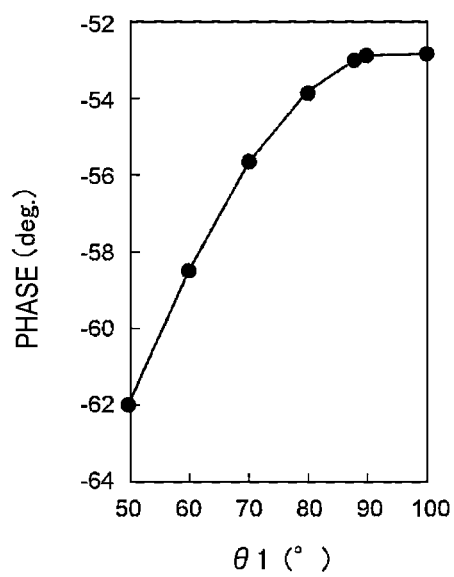
FIG. 12 is a diagram illustrating a relationship between the taper angle θ1 in the acoustic wave device of the first preferred embodiment of the present invention and a phase of a higher order mode closest to a main mode.

FIG. 12 is a diagram illustrating a relationship between the taper angle θ1 and the phase of the higher order mode which is closest to the main mode indicated by an arrow X in FIG. 5. As is apparent from FIG. 12, it can be seen that the phase of the higher order mode becomes small when the taper angle θ1 is equal to or more than about 50° and equal to or less than about 88°, as compared with a case where the taper angle θ1 is about 90°, i.e., the taper is not provided. Further, it can be seen that a magnitude of the phase of the higher order mode is saturated and does not become small as long as it is within the range of equal to or more than about 90° and equal to or less than about 100°.

Therefore, in the acoustic wave device 51, since the taper angle θ1 is equal to more than about 50° and equal to or less than about 88°, it is possible to effectively reduce or prevent the influence of the higher order mode. In particular, the taper angle θ1 is more preferably equal to or less than about 80°, for example.

In a case where the acoustic wave device 1 is used for the band pass filter of the composite filter device 30 illustrated in FIG. 4, for example, when the higher order mode appears, there is a possibility that the filter characteristics of the other band pass filters may be adversely affected. That is, when the frequency generated in the higher order mode is located within the pass band of the other band pass filter, the filter characteristics of the other band pass filters are also deteriorated. Therefore, it is preferable that the higher order mode other than the main mode to be used is reduced or prevented. In the present preferred embodiment, since the taper angle θ1 is equal to or less than about 88°, the above-described higher order mode can be effectively reduced or prevented.

Note that, although not illustrated in FIG. 5, not only the higher order mode closest to the main mode appears but also the higher order mode appears in the vicinity of the frequency two times the resonant frequency of the main mode.

Figure 13:
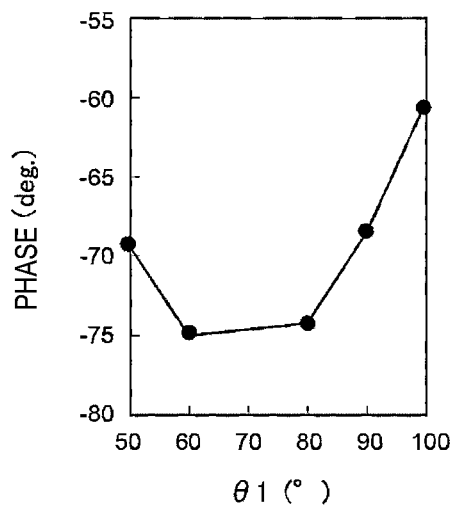
FIG. 13 is a diagram illustrating a relationship between the taper angle θ1 in the acoustic wave device of the first preferred embodiment of the present invention and a phase of the higher order mode near the frequency two times a resonant frequency of the main mode.

FIG. 13 is a diagram illustrating a relationship between the taper angle θ1 and the phase of the higher order mode near the frequency two times the resonant frequency. As is apparent from FIG. 13, when the taper angle θ1 is equal to or more than about 60° and equal to or less than about 80°, it is possible to effectively reduce or prevent the higher order mode. Therefore, more preferably, the taper angle θ1 is equal to or more than about 60° and equal to or less than about 80°, for example.

Note that, in FIG. 11, an inclination angle α is an angle between the side surface 11c and the lower surface 11a in the forward tapered structure of the first electrode finger 11.

Figure 14:
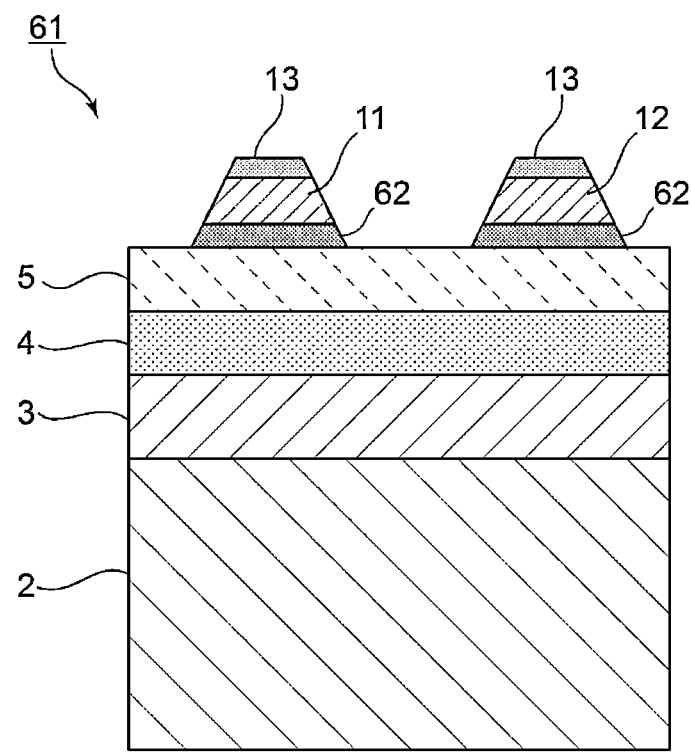
FIG. 14 is a front sectional view of an acoustic wave device according to a seventh preferred embodiment of the present invention.

FIG. 14 is a front sectional view of an acoustic wave device according to a seventh preferred embodiment of the present invention. An acoustic wave device 61 of the seventh preferred embodiment has the same or substantially the same configuration as the acoustic wave device 1 of the first preferred embodiment, except that the first and second electrode fingers 11 and 12 have a tapered shape similar to that in the sixth preferred embodiment, and that a second dielectric film 62 is provided. The second dielectric film 62 is laminated between the upper surface 5a of the piezoelectric body 5 and the first and second electrode fingers 11 and 12. In the present preferred embodiment, the second dielectric film 62 is preferably a silicon oxide film, for example. The dielectric of the second dielectric film 62 is not limited thereto. An appropriate dielectric such as, for example, silicon oxynitride, alumina, tantalum oxide, or the like may be used. Further, for example, a material including these dielectrics as a main component and including another dielectric or an element added thereto may be used.

The second dielectric film 62 does not extend to the entire area of the gap between the first and second electrode fingers 11 and 12. However, here, the gap refers to an exposed region between the upper surfaces 5a of the piezoelectric body 5 between the second dielectric films 62 and 62 integrated with the first and second electrode fingers 11 and 12 instead of the entire area between lower ends of the first and second electrode fingers 11 and 12. Therefore, also in the acoustic wave device 61 of the seventh preferred embodiment, the dielectric is not present in the entire area of the gap. However, the acoustic wave device 61 of the seventh preferred embodiment may also be provided with a fillet as described above. Further, in the gap, a dielectric may be present in a partial region.

A material of the second dielectric film 62 need not necessarily be the same as the material of the first dielectric film 13, and may be different therefrom.

The side surface of the first electrode finger 11 of the IDT electrode 6 and the upper surface 5a of the piezoelectric body 5 in the gap between the electrode fingers are not covered with a dielectric. Therefore, a surface acoustic wave effectively propagates in the piezoelectric body 5. Therefore, since a viscous loss of the piezoelectric body is smaller than a viscous loss of the dielectric, it is possible to effectively reduce or prevent the deterioration of the Q value.

Therefore, even in the acoustic wave device 61, since the dielectric is not present in a portion between the first electrode finger 11 and the second electrode finger 12, it is possible to reduce or prevent the degradation of the Q value as in the first preferred embodiment.

Further, due to the second dielectric film 62 being provided, it is possible to adjust the frequency to narrow a fractional bandwidth. Further, the frequency adjustment can be easily performed by adjusting the thickness and the material of the first dielectric film 13 on the upper side.

Figure 15:
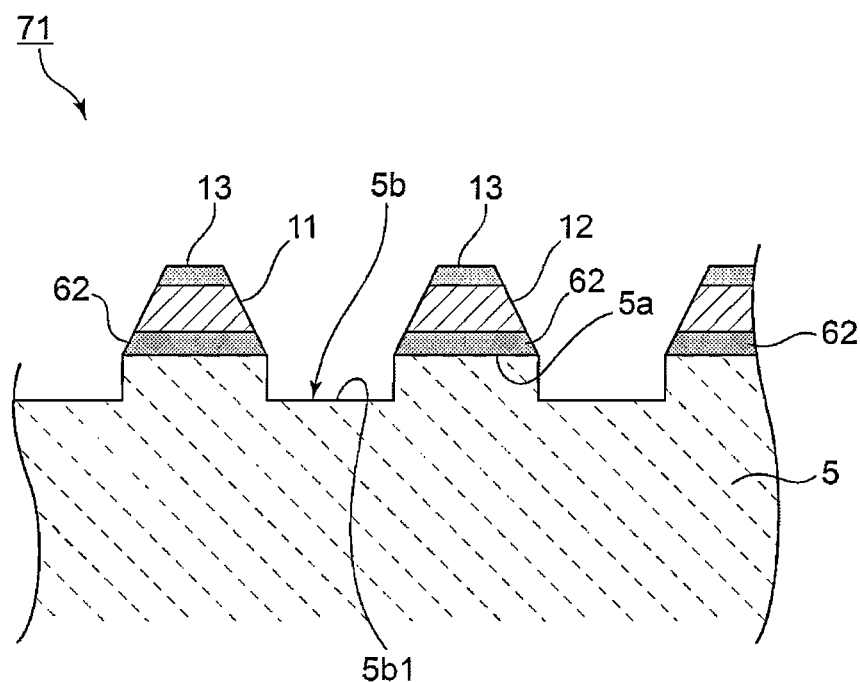
FIG. 15 is a front sectional view of an acoustic wave device according to an eighth preferred embodiment of the present invention.

FIG. 15 is a front sectional view of an acoustic wave device according to an eighth preferred embodiment of the present invention. In an acoustic wave device 71 according to the eighth preferred embodiment, a groove 5b is provided on the upper surface 5a of the piezoelectric body 5 in the gap between the first electrode finger 11 and the second electrode finger 12. Except that the groove 5b is provided, the acoustic wave device 71 has the same or substantially the same configuration as the acoustic wave device 61 according to seventh preferred embodiment. Since the groove 5b is provided, a bottom surface 5b1 of the groove 5b is lower than the upper surface 5a of the piezoelectric body 5.

In the acoustic wave device 71, since the grooves 5b is provided, it is possible to further increase the Q value. This will be described with reference to FIG. 16.

As an example of the acoustic wave device 71, the second dielectric film 62 was not provided, and an acoustic wave device of Example 3 of a preferred embodiment of the present invention below was prepared without the second dielectric film 62.

The parameters of Example 3 are as follows.

Orientation of a support substrate made of Si: (111) plane.

High acoustic velocity member 3: silicon nitride film, thickness of about 300 nm.

Low acoustic velocity film 4: silicon oxide film, thickness of about 225 nm.

Piezoelectric body 5: 50° Y cut $LiTaO_3$, thickness of about 300 nm.

The wave length λ=about 2 μm determined by the electrode finger pitch of the IDT electrode 6.

The number of pairs of the electrode fingers of the IDT electrode 6=100 pairs, the duty=about 0.5.

The width direction dimension of the first and second electrode fingers 11 and 12=about 30 μm.

The electrode structure of the IDT electrode 6 and the reflectors 7 and 8 is a laminated structure of Ti film/Al film/Ti film from bottom. From the bottom, the thickness of Ti film=about 16 nm, the thickness of Al film=120 nm, and the thickness of Ti film=about 4 nm.

First dielectric film 13: silicon oxide film, thickness=about 35 nm, taper angle θ1=about 78°.

Note that the definition of a second taper angle θ2 will be described later.

The acoustic wave device of Example 3 having the above-described design parameters and an acoustic wave device of Example 4 that is configured in the same or similar manner as the acoustic wave device 71, except that the groove 5b was not provided were prepared.

Figure 16:
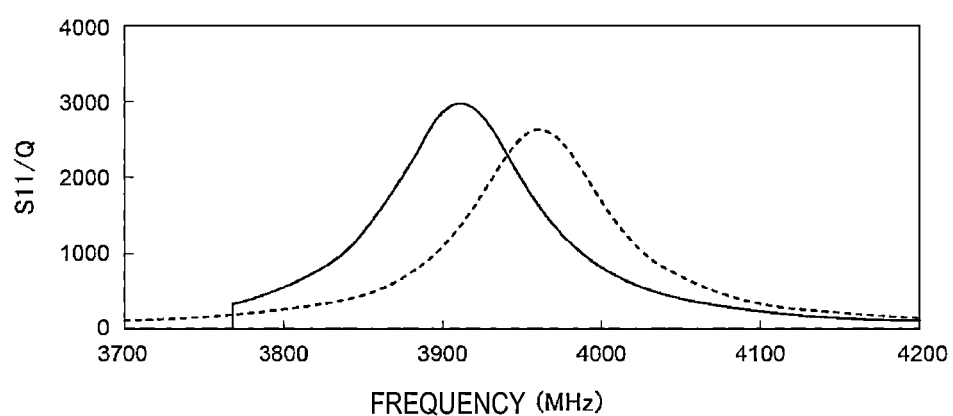
FIG. 16 is a diagram illustrating Q characteristics of Example 3 of the acoustic wave device illustrated in FIG. 15 and Example 4 in which a groove is not provided on an upper surface of the piezoelectric body.

FIG. 16 is a diagram illustrating Q characteristics of the acoustic wave devices of Example 3 and Example 4 described above. A solid line indicates results of Example 3, and a dashed line indicates results of Example 4. As is apparent from FIG. 16, it can be seen that the Q characteristics can be more effectively improved in Example 3 in which the groove 5b is provided.

Figure 17:
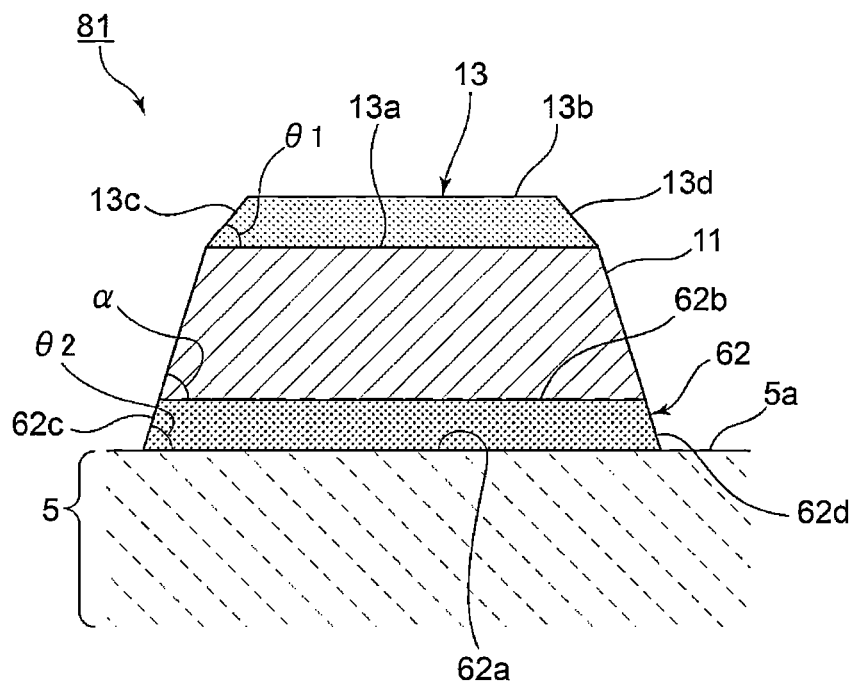
FIG. 17 is a partially enlarged front sectional view for describing an acoustic wave device according to a ninth preferred embodiment of the present invention.

FIG. 17 is a partially enlarged front sectional view for describing an acoustic wave device according to a ninth preferred embodiment of the present invention. An acoustic wave device 81 is configured in the same or substantially the same manner as the acoustic wave device 61. However, the taper angle θ2>taper angle θ1 illustrated in FIG. 17 is provided. Here, the taper angle θ2 is an inclination angle of third and fourth side surfaces 62c and 62d of the second dielectric film 62. The second dielectric film 62 includes a lower surface 62a, an upper surface 62b, and the third and fourth side surfaces 62c and 62d. The second dielectric film 62 has a tapered shape as described above. Therefore, the third side surface 62c forms the taper angle θ2 with the lower surface 62a, i.e., the upper surface 5a of the piezoelectric body 5.

Figure 18:
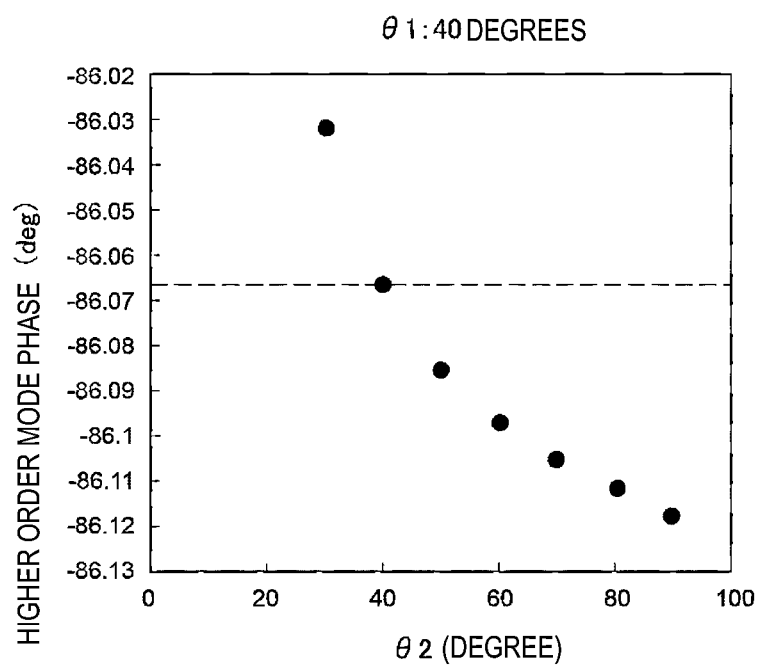
FIG. 18 is a diagram illustrating a relationship between a taper angle θ2 of a side surface of a second dielectric film and a phase of the higher order mode closest to the main mode in a case where the taper angle θ1 of the side surface of the first dielectric film is about 40°.

The feature of the present preferred embodiment is θ2>θ1, which effectively reduces or prevents the higher order mode. This will be described with reference to FIG. 18. The taper angle θ1 of the side surface of the first dielectric film 13 was fixed at about 40°, and the taper angle θ2 of a side surface of the second dielectric film 62 was changed. FIG. 18 is a diagram illustrating a relationship between the taper angle θ2 and the phase of the higher order mode closest to the main mode. Note that the other design parameters are the same as those in Example 4 described above. That is, in the piezoelectric body, no groove was provided in the gap between the electrode fingers.

As is apparent from FIG. 18, it can be seen that when the taper angle θ2 of the second dielectric film 62 exceeds about 40°, the phase of the higher order mode becomes extremely small. Therefore, preferably θ2>θ1 is satisfied, which effectively reduces or prevents the higher order mode.

Figure 19:
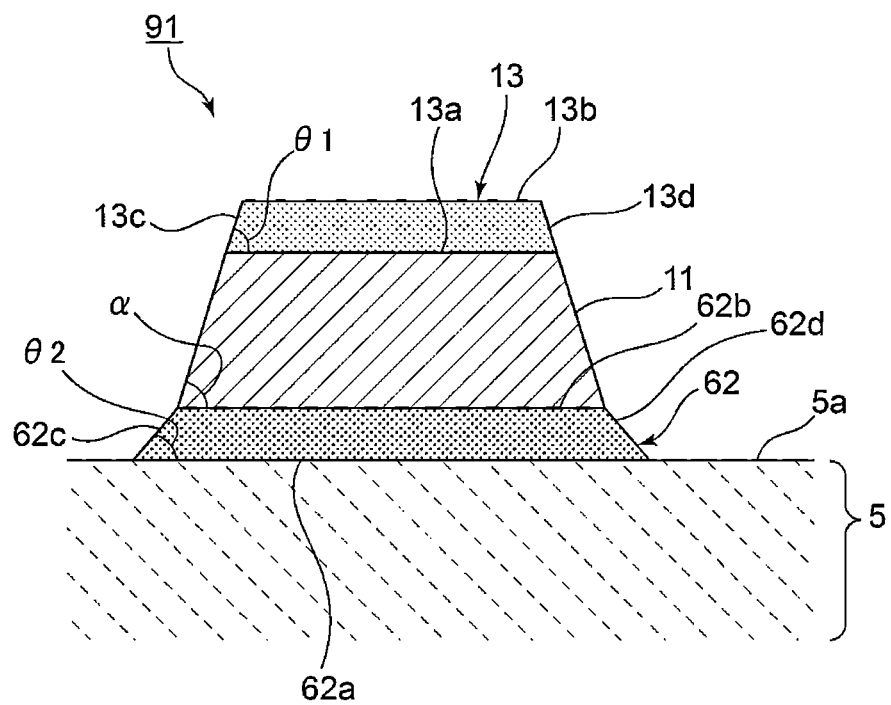
FIG. 19 is a partially enlarged front sectional view for describing an acoustic wave device according to a tenth preferred embodiment of the present invention.
Figure 20:
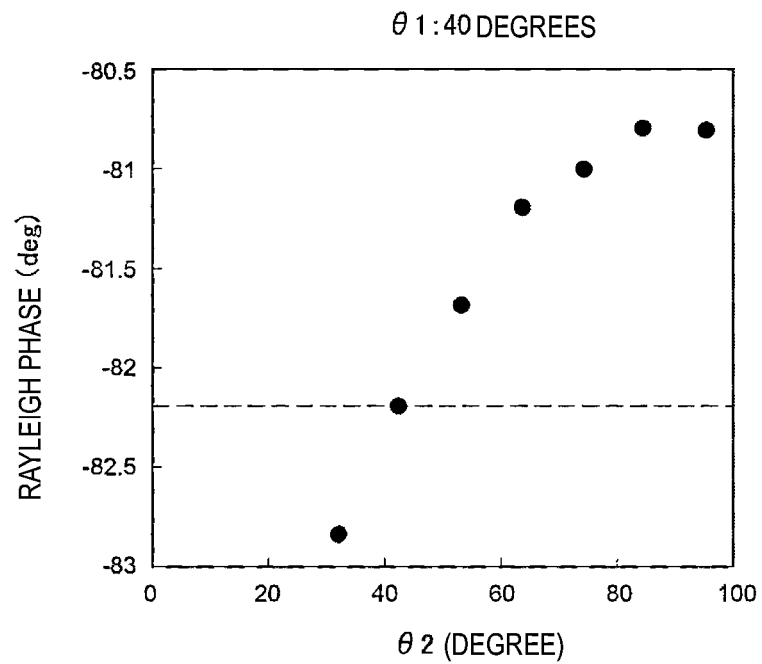
FIG. 20 is a diagram illustrating a relationship between the taper angle θ2 of the side surface of the second dielectric film and a phase in a Rayleigh wave in a case where the taper angle θ1 of the side surface of the first dielectric film is about 40°.

FIG. 19 is a partially enlarged front sectional view for describing an acoustic wave device according to a tenth preferred embodiment of the present invention. In an acoustic wave device 91, as opposed to the acoustic wave device 81, the taper angle θ1>the taper angle θ2 is satisfied. The other configurations of the acoustic wave device 91 are the same as or similar to those of the acoustic wave device 81. FIG. 20 is a diagram illustrating a change in the phase of a Rayleigh wave in a case where the taper angle θ1 of the side surface of the first dielectric film 13 is fixed at about 40° and the taper angle θ2 of the side surface of the second dielectric film 62 is changed. As is apparent from FIG. 20, when the taper angle θ2 is smaller than about 40°, it is possible to reduce the phase of the Rayleigh wave. Therefore, it is possible to effectively reduce or prevent the Rayleigh wave as a spurious wave.

Figure 21:
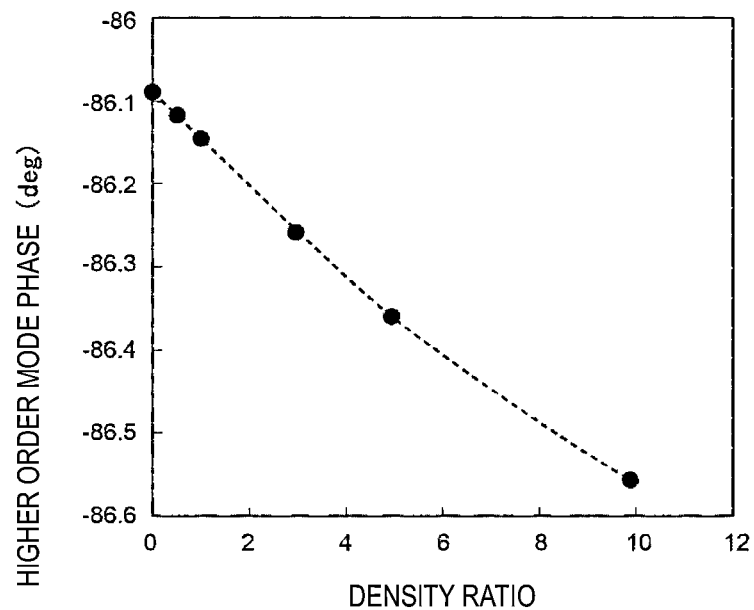
FIG. 21 is a diagram illustrating a relationship between a density ratio of a density D2 of the second dielectric film/a density D1 of the first dielectric film and the phase of the higher order mode closest to the main mode.

FIG. 21 is a diagram illustrating a relationship between a density ratio=(density D2 of the second dielectric film 62/density D1 of the first dielectric film 13) and the phase of the higher order mode closest to the main mode. Note that the design parameters of the acoustic wave device were set to be the same or substantially the same as those in Example 4. Here, the first dielectric film 13 was made of silicon oxide, and the density of the second dielectric film 62 was changed with the change of a material of the second dielectric film 62. Note that the silicon oxide has a density of about $2.2 \times 10^3$ $kg/m^3$.

As is apparent from FIG. 21, as the density ratio becomes larger than 1, the phase of the higher order mode decreases. Therefore, it is preferably D2>D1.

Figure 22:
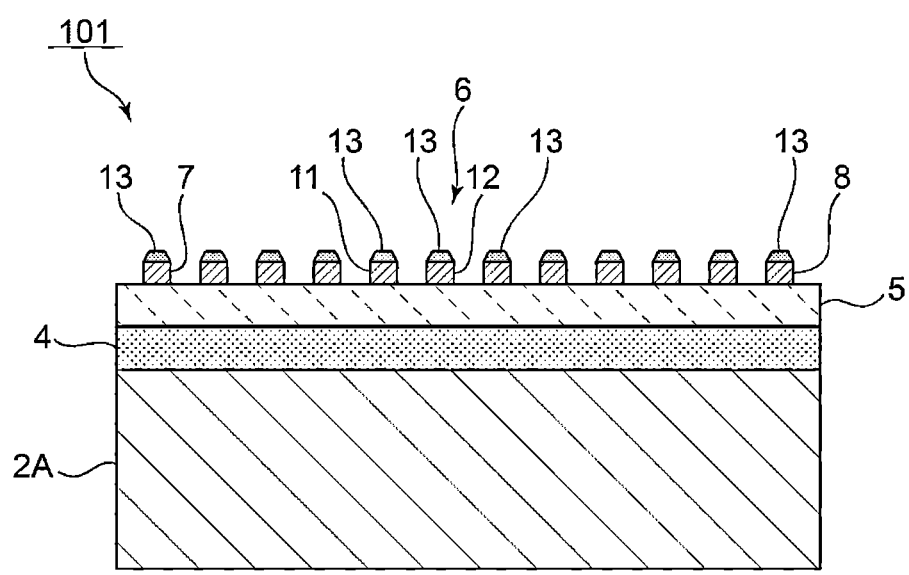
FIG. 22 is a front sectional view of an acoustic wave device according to an eleventh preferred embodiment of the present invention.

FIG. 22 is a front sectional view of an acoustic wave device according to an eleventh preferred embodiment of the present invention. An acoustic wave device 101 does not include the high acoustic velocity member 3. Further, the support substrate 2 is a high acoustic velocity support substrate 2A made of a high acoustic velocity material. As described above, as the high acoustic velocity member, the high acoustic velocity support substrate 2A may be used.

Figure 23:
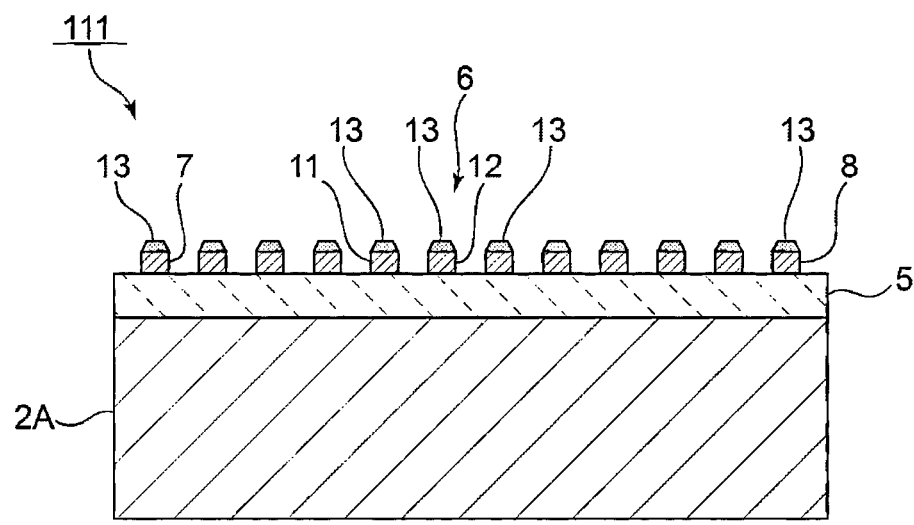
FIG. 23 is a front sectional view of an acoustic wave device according to a twelfth preferred embodiment of the present invention.

FIG. 23 is a front sectional view of an acoustic wave device according to a twelfth preferred embodiment of the present invention. In an acoustic wave device 111, the low acoustic velocity film 4 in the acoustic wave device 101 is removed. The other configurations of the acoustic wave device 111 are the same or substantially the same as those of the acoustic wave device 101. As described above, the high acoustic velocity support substrate 2A may be laminated as a high acoustic velocity member on a surface opposite to the side on which the IDT electrode 6 of the piezoelectric body 5 is provided.

The acoustic wave device according to each of the above-described preferred embodiments can be used as a duplexer of a high-frequency front end circuit, or the like. This example will be described below.

Figure 24:
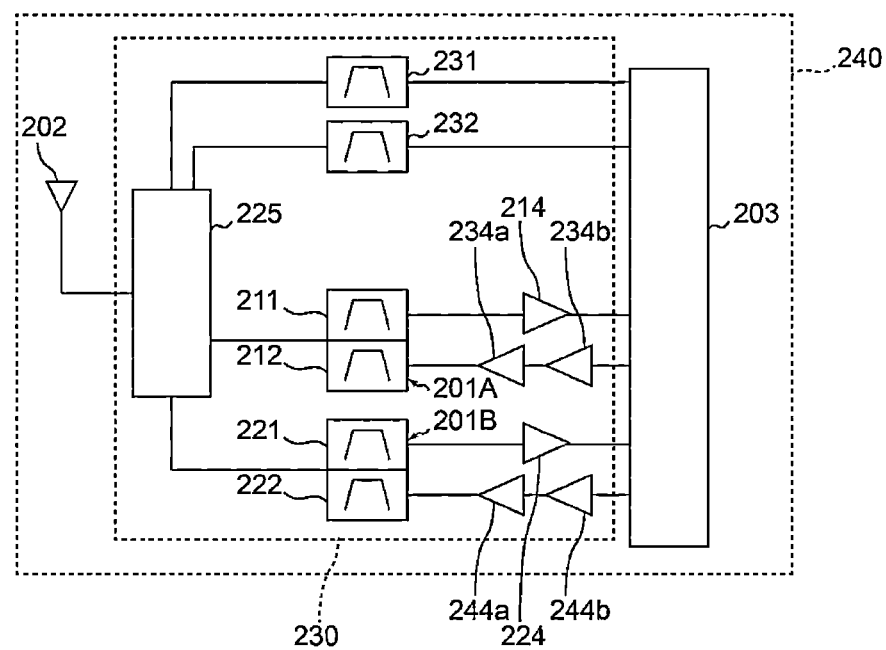
FIG. 24 is a circuit diagram for describing a high-frequency front end circuit and a communication device according to a preferred embodiment of the present invention.

FIG. 24 is a configuration diagram of a communication device and a high-frequency front end circuit. Note that, in FIG. 24, components, for example, an antenna element 202 and an RF signal processing circuit (RFIC) 203, connected to a high-frequency front end circuit 230 are also illustrated. The high-frequency front end circuit 230 and the RF signal processing circuit 203 define a communication device 240. Note that the communication device 240 may include a power supply, a CPU, and a display, for example.

The high-frequency front end circuit 230 includes a switch 225, duplexers 201A and 201B, filters 231 and 232, low-noise amplifier circuits 214 and 224, and power amplifier circuits 234a, 234b, 244a, and 244b. Note that the high-frequency front end circuit 230 and the communication device 240 in FIG. 24 are examples of a high-frequency front end circuit and a communication device, and are not limited to this configuration.

The duplexer 201A includes filters 211 and 212. The duplexer 201B includes filters 221 and 222. The duplexers 201A and 201B are connected to the antenna element 202 via the switch 225. Note that the acoustic wave devices according to the preferred embodiments of the present invention described above may be used for the duplexers 201A and 201B, or may be used for the filters 211, 212, 221, and 222.

Further, the acoustic wave devices according to the preferred embodiments of the present invention described above can also be used for a multiplexer having equal to or more than 3 filters, for example, a triplexer in which antenna terminals of three filters are common to each other, a hexaplexer in which antenna terminals of six filters are common to each other, and the like.

That is, the acoustic wave devices according to the preferred embodiments of the present invention described above include an acoustic wave resonator, a filter, a duplexer, and a multiplexer including three or more filters, for example. The multiplexer is not limited to a configuration including both a transmit filter and a receive filter, and may include only a transmit filter or only a receive filter.

The switch 225 connects the antenna element 202 and a signal path corresponding to a predetermined band in accordance with a control signal from a control unit (not illustrated), and is defined by, for example, a single pole double throw (SPDT) switch. Note that the number of signal paths connected to the antenna element 202 is not limited to one, and a plurality of signal paths may be provided. That is, the high-frequency front end circuit 230 may correspond to carrier aggregation.

The low-noise amplifier circuit 214 is a reception amplifier circuit that amplifies a high-frequency signal (here, a high-frequency reception signal) having passed through the antenna element 202, the switch 225, and the duplexer 201A, and outputs the amplified high-frequency signal to the RF signal processing circuit 203. The low-noise amplifier circuit 224 is a reception amplifier circuit that amplifies a high-frequency signal (here, a high-frequency reception signal) having passed through the antenna element 202, the switch 225, and the duplexer 201B, and outputs the amplified high-frequency signal to the RF signal processing circuit 203.

The power amplifier circuits 234a and 234b are transmission amplifier circuits that amplify the high-frequency signal (here, a high-frequency transmission signal) output from the RF signal processing circuit 203 and output the amplified high-frequency signal to the antenna element 202 via the duplexer 201A and the switch 225. The power amplifier circuits 244a and 244b are transmission amplifier circuits that amplify the high-frequency signal (here, a high-frequency transmission signal) output from the RF signal processing circuit 203 and output the amplified high-frequency signal to the antenna element 202 via the duplexer 201B and the switch 225.

The RF signal processing circuit 203 performs signal processing on the high-frequency reception signal input from the antenna element 202 via a reception signal path by down-conversion or the like, for example, and outputs a reception signal generated by the signal processing. Moreover, the RF signal processing circuit 203 performs signal processing on the input transmission signals by up-conversion or the like, for example, and outputs the high-frequency transmission signals generated by the signal processing to the power amplifier circuits 234a, 234b, 244a, and 244b. The RF signal processing circuit 203 is, for example, an RFIC. Note that the communication device may include a BB (baseband) IC. In this case, the BBIC performs signal processing on the reception signal processed by the RFIC. Further, the BBIC performs signal processing on the transmission signal, and outputs the signal to the RFIC. The reception signal processed by the BBIC and the transmission signal before the BBIC performs the signal processing are, for example, an image signal, an audio signal, and the like.

Note that the high-frequency front end circuit 230 may include a duplexer according to a modification of the above-described duplexers 201A and 201B, instead of the duplexers 201A and 201B.

On the other hand, the filters 231 and 232 in the communication device 240 are connected between the RF signal processing circuit 203 and the switch 225 without passing through the low-noise amplifier circuit 214 and 224 and the power amplifier circuits 234a, 234b, 244a, and 244b. Similarly to the duplexers 201A and 201B, the filters 231 and 232 are also connected to the antenna element 202 via the switch 225.

Although the acoustic wave devices, the acoustic wave filters, the composite filter devices, the high-frequency front end circuits, and the communication devices according to the preferred embodiments of the present invention have been described above with reference to the preferred embodiments and the modification thereof, the present invention also includes other preferred embodiments that are obtained by combining any of the elements in the above-described preferred embodiments and the modifications, modifications obtained by applying various changes that are conceivable by those skilled in the art to the above preferred embodiments without departing from the gist of the present invention, and various kinds of devices integrating the high-frequency front end circuits and the communication devices according to preferred embodiments of the present invention. Preferred embodiments of the present invention can be widely used, for example, as a multiplexer, a front end circuit, and a communication device that are applicable to an acoustic wave resonator, a filter, a duplexer, and a multiband system, in communication devices, such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric body including a first main surface and a second main surface that face each other;
   an IDT electrode on the first main surface of the piezoelectric body, and including a plurality of electrode fingers;
   a high acoustic velocity member on a side of the second main surface of the piezoelectric body, in which an acoustic velocity of a bulk wave propagating through the high acoustic velocity member is higher than an acoustic velocity of an acoustic wave propagating through the piezoelectric body; and
   a first dielectric film on an upper surface of the electrode finger; wherein
   a portion in which a dielectric is not present is between the plurality of electrode fingers of the IDT electrode; and
   a film thickness of the first dielectric film is equal to or less than about 4% of a wave length λ determined by an electrode finger pitch of the plurality of electrode fingers.

2. An acoustic wave device comprising:
   a piezoelectric body including a first main surface and a second main surface that face each other;
   an IDT electrode on the one first surface of the piezoelectric body, and including a plurality of electrode fingers;
   a high acoustic velocity member on the second main surface side of the piezoelectric body; and
   a first dielectric film on an upper surface of the plurality of electrode fingers; wherein
   the high acoustic velocity member includes a medium including at least one of or a mixture of aluminum nitride, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, DLC (diamond-like carbon) films, or diamond as a main component;
   a portion in which a dielectric is not present is between the electrode fingers of the IDT electrode; and
   a film thickness of the first dielectric film is equal to or less than about 4% of a wave length λ determined by an electrode finger pitch of the plurality of electrode fingers.

3. The acoustic wave device according to claim 1, wherein the first dielectric film is not present in an entire or substantially an entire area between the electrode fingers.

4. The acoustic wave device according to claim 1, wherein
   a fillet of the dielectric is provided in at least one portion between the plurality of electrode fingers;
   the fillet extends from a side surface of at least one electrode finger of the plurality of electrode fingers through a boundary between the at least one electrode finger and the first main surface of the piezoelectric body, and extends to a portion of the first main surface between the plurality of electrode fingers; and
   in a cross section in a direction orthogonal or substantially orthogonal to a direction in which the plurality of electrode finger extend, an outer surface of the fillet is curved and recessed toward a corner portion that is a boundary between the side surface of the at least one electrode finger in a cross section and the first main surface of the piezoelectric body.

5. The acoustic wave device according to claim 1, wherein a groove is provided in the first main surface of the piezoelectric body between the plurality of electrode fingers.

6. The acoustic wave device according to claim 1, wherein each of the plurality of electrode fingers has a tapered shape.

7. The acoustic wave device according to claim 1, wherein the first dielectric film has a tapered shape, and a taper angle of the tapered shape is equal to or less than about 88°.

8. The acoustic wave device according to claim 7, wherein the taper angle is equal to or more than about 50°.

9. The acoustic wave device according to claim 7, wherein the taper angle is equal to or more than about 60° and equal to or less than about 80°.

10. The acoustic wave device according to claim 1, further comprising a second dielectric film between the piezoelectric body and the electrode finger.

11. The acoustic wave device according to claim 10, wherein the second dielectric film is not present in an entire or substantially an entire area between the plurality of electrode fingers.

12. The acoustic wave device according to claim 10, wherein
   the first dielectric film and the second dielectric film each have a tapered shape; and
   when a taper angle of the tapered shape of the first dielectric film is defined as θ1, and a taper angle of the tapered shape of the second dielectric film is defined as θ2, θ1>θ2 is satisfied.

13. The acoustic wave device according to claim 10, wherein
   the first dielectric film and the second dielectric film each have a tapered shape; and
   when a taper angle of the tapered shape of the first dielectric film is defined as θ1, and a taper angle of the tapered shape of the second dielectric film is defined as θ2, θ1<θ2 is satisfied.

14. The acoustic wave device according to claim 10, wherein when a density of the first dielectric film is defined as D1, and a density of the second dielectric film is defined as D2, D2>D1 is satisfied.

15. The acoustic wave device according to claim 1, wherein the high acoustic velocity member is a high acoustic velocity support substrate mainly including a high acoustic velocity material.

16. The acoustic wave device according to claim 1, further comprising:
   a low acoustic velocity film between the high acoustic velocity member and the piezoelectric body; wherein
   an acoustic velocity of a bulk wave propagating through the low acoustic velocity member is lower than an acoustic velocity of a bulk wave propagating through the piezoelectric body.

17. The acoustic wave device according to claim 1, wherein the first dielectric film is a silicon oxide film.

18. The acoustic wave device according to claim 2, wherein the first dielectric film is not present in an entire or substantially an entire area between the electrode fingers.

19. An acoustic wave device comprising:
   a piezoelectric body including a first main surface and a second main surface that face each other;
   an IDT electrode on the first main surface of the piezoelectric body, and including a plurality of electrode fingers;
   a high acoustic velocity member on a side of the second main surface of the piezoelectric body, in which an acoustic velocity of a bulk wave propagating through the high acoustic velocity member is higher than an acoustic velocity of an acoustic wave propagating through the piezoelectric body; and a first dielectric film on an upper surface of the electrode finger; wherein a portion in which a dielectric is not present is between the plurality of electrode fingers of the IDT electrode;

a fillet of the dielectric is provided in at least one portion between the plurality of electrode fingers;

the fillet extends from a side surface of at least one electrode finger of the plurality of electrode fingers through a boundary between the at least one electrode finger and the first main surface of the piezoelectric body, and extends to a portion of the first main surface between the plurality of electrode fingers; and in a cross section in a direction orthogonal or substantially orthogonal to a direction in which the plurality of electrode finger extend, an outer surface of the fillet is curved and recessed toward a corner portion that is a boundary between the side surface of the at least one electrode finger in a cross section and the first main surface of the piezoelectric body.

* * * * *